United States Patent [19]

Watrous, Jr.

[11] 4,092,661
[45] May 30, 1978

[54] MOSFET TRANSISTOR

[75] Inventor: Willis G. Watrous, Jr., Mountain View, Calif.

[73] Assignee: Intel Corporation, Santa Clara, Calif.

[21] Appl. No.: 688,466

[22] Filed: May 20, 1976

Related U.S. Application Data

[62] Division of Ser. No. 450,773, Mar. 13, 1974, Pat. No. 3,986,903.

[51] Int. Cl.² .............................................. H01L 29/78
[52] U.S. Cl. .......................................... 357/23; 357/90
[58] Field of Search ................................. 357/23, 90

[56] References Cited

U.S. PATENT DOCUMENTS

| 3,737,347 | 6/1973 | Alcott et al. ................. 357/90 X |
| 3,967,981 | 7/1976 | Yamazaki ..................... 357/23 X |

FOREIGN PATENT DOCUMENTS 1,326,947    8/1973    United Kingdom ................... 357/23

OTHER PUBLICATIONS

Platt et al., "FET Fabrication," *IBM TDB*, vol. 14, No. 1, Jun. 1971, pp. 247-248.
Krick et al., "Integratable, Symmetrical, High-Voltage MOSFET Structure," *IBM TDB*, vol. 15, No. 6, Nov. 1972, pp. 1884-1885.

*Primary Examiner*—Stanley D. Miller, Jr.
*Assistant Examiner*—James W. Davie
*Attorney, Agent, or Firm*—Spensley, Horn & Lubitz

[57] ABSTRACT

An n channel MOSFET transistor which includes doping of previously formed source and drain elements with a heavy diffusion of phosphorous or arsenic creating n++ regions in the source and drain. The extra diffusion step is preferably accomplished just prior to contact metalization.

3 Claims, 11 Drawing Figures

MOSFET TRANSISTOR

This is a division of application Ser. No. 450,773, filed Mar. 13, 1974 now U.S. Pat. No. 3,986,903.

BACKGROUND OF THE INVENTION

1. Field of the Invention

This invention relates to semiconductor devices and more specifically to MOS field effect transistors.

2. Prior Art

MOSFET devices are well known in the prior art and are described in many patents and publications. One such source of prior art practice is a book "MOS Integrated Circuits" (1972) edited by William M. Penney and Lillian Lau.

The structure of a MOSFET device, as disclosed by the prior art, includes a monocrystalline semiconductor region (e.g., substrate wafer) with a pair of closely spaced regions on the surface, opposite in conductivity type as compared with the substrate, called the source and the drain. A gate electrode, made either of an appropriate material, such as, a metal, or a semiconductor material, removed from the wafer by a layer of insulating material such as silicon oxide or nitride or a combination thereof which insulating material covers the area between the source and the drain. Various maskings, oxidation steps and metalizations are used in the process of forming the device elements and making contact with them. The impedance existing between the source and drain elements is controlled by the potential applied to the gate element.

Certain difficulties have been noted in the prior art devices which have been eliminated by the present invention. For example, in prior art devices "junction spiking" is a very common defect. This defect comes about because of the preferential etching which occurs along the 100 plane in a monocrystalline silicon wafer (hereinafter referred to as "100 plane silicon"). The 100 plane silicon is often used in n-channel MOS devices although 111 plane silicon may be employed. (In 111 plane silicon the preferential etching tends to occur in a lateral plane.) The preferential etching defect results from the processing temperatures commonly used after metalization (e.g., aluminum), which enables material from the substrate (e.g., silicon) to diffuse from the contact area of the substrate into the metalization and conversely the metalization flows to fill the voids in the substrate (e.g., contact areas of substrate). Thus, the substrate material dissolves in the metalization. Further, the metalization (e.g., aluminum) often dissolves the substrate material (e.g., silicon) in a preferential manner that produces metal penetration much further into the substrate than would be the case if the dissolution of the substrate and the subsequent penetration by the metalization were isotropic (radiating equally in all directions). If the metalization penetrates through the junction it often results in a short of the junction. This phenomena is known in the industry as junction spiking. As will be described later, preferential etching does not tend to occur in the invented device. In addition, the junctions can be preferentially deepened in the vicinity of the contacts. Both of these improvements result in a device that is much less prone to junction spiking.

An important use of MOS devices is for dynamic memory purposes. In this application, information may be stored in the cell for a short period of time due to the effect of minority carrier lifetime in the source and drain elements and associated effective capacitance. In prior art devices the storage time available is often quite short and very sensitive to the presence of certain impurities in the semiconductor material. Because of the greatly increased minority carrier lifetime of a cell employing the invention, the yields of parts with an acceptable storage time can be significantly increased. Alternatively, it is possible to maintain the present yields and produce parts having a substantially longer refresh cycle. Thus, when circuits employing the invention are in use, it is possible that such circuits will employ a much smaller percentage of available system time to restore and maintain the stored information. In substance, a dynamic cell is, without structural addition or the addition of components, made to approach the performance of a static cell which generally requires many more components. This result is attained with a number of other advantages incident thereto. For example, it is possible in an n-channel MOS device to deepen the junctions in the vicinity of the contacts to the source and drain without making the source and drain equally deep at portions directly adjacent the gate. Thus, low gate to drain capacitance may be obtained enabling high-speed performance while permitting simple metalization. Also, the metal cracking problem is simultaneously provided for and greater flexibility and tolerance are enabled in the metalization.

SUMMARY OF THE INVENTION

The present invention is described herein, by way of example, as a silicon gate MOSFET, however, the invented method is applicable to various forms of field effect devices such as, for example, metal gate MOS, silicon gate MOS, FAMOS devices, MNOS devices, charge coupled devices, bucket brigade devices, or silicon on sapphire or other insulator devices. All such devices and similar devices shall be within the term "field effect devices."

The processing of a MOSFET device in accordance with the present invention proceeds along conventional lines up to the metalization of contacts onto the source, drain and gate elements. After preparation for metalization, including masking, etc., but prior to metalizing, a heavy doping of phosphorous or arsenic or other material is made onto the surface of the wafer, resulting in a heavily doped n++ region in both the source and drain. This step is followed by an etchant dip to remove any oxides formed on the surfaces where electrical contact will be made to the device and then metalization is accomplished as disclosed by the prior art.

DETAILED DESCRIPTION OF THE INVENTION

Figure 1:
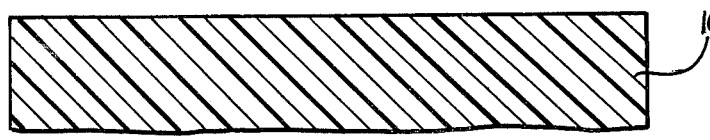
FIG. 1 is a cross-sectional view of a substrate on which the invented MOS device is fabricated.

In accordance with one embodiment of the invention, a substrate or region of p-type monocrystalline silicon (e.g., with 100 plane orientation) is used to form an $n$ channel MOS field effect transistor. The substrate may be a thick, mechanically substantial wafer or may be a thin layer of p-type silicon deposited on some other form of base. For example, one type of construction which could be used is the so-called silicon on sapphire configuration which consists simply of a thin layer of silicon deposited on a sapphire wafer. The substrate, whether it be mechanically independent or merely a layer on another base is indicated in FIG. 1 by numeral 10. While only one device is shown being fabricated on the substrate, common practice is to use a single substrate wafer for a large number of devices (e.g., 100 or more chips each containing 1000 or more MOSFETS).

Figure 2:
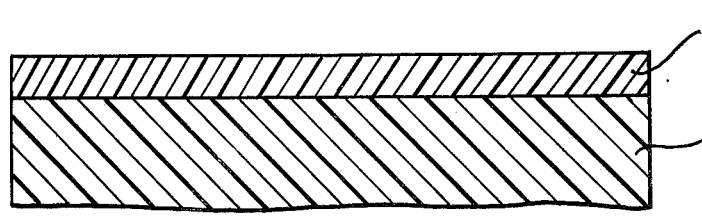
FIG. 2 is the substrate of FIG. 1 after a layer of silicon dioxide has been added thereon.
Figure 3:
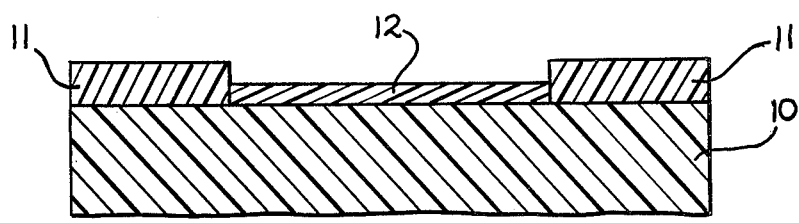
FIG. 3 is a cross-sectional view of the device after removing the oxide coating from an area of the substrate and regrowing a thinner oxide layer.

By way of an example but not as a limitation, the invention will be described as it applies to a fairly common n-channel Si gate process. The first step of the process is the growing of a thick layer of silicon oxide 11 (e.g., $S/O_2$) on the top surface of the substrate 10 as shown in FIG. 2. The thickness of the layer is typically one micron thick. Alternatively, this layer may be chemically deposited. Next, the area which is to be the site of the invented MOS device is etched, using conventional photo fabrication techniques, to remove a portion of the oxide layer 11 or the site of the invented device may be left substantially non-oxide covered by the presence of a suitable oxidation barrier (silicon nitride) during the growth of the thick oxide. (For example, see *Electronics*, Dec. 21, 1971, pp. 43–48.) A thin layer of silicon dioxide 12, typically 1000 angstroms thick, is then regrown or deposited in the etched area. The device at this stage of fabrication is shown in FIG. 3.

Figure 4:
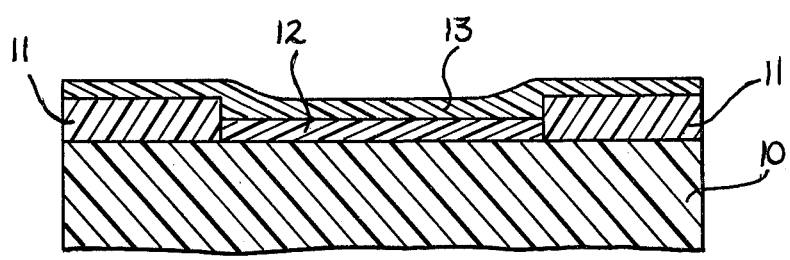
FIG. 4 is the device of FIG. 3 after deposition of a silicon layer.
Figure 5:
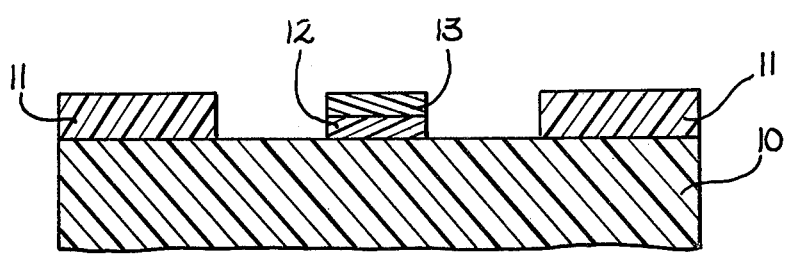
FIG. 5 is a cross-sectional view of the device after the silicon gate has been formed.
Figure 5A:
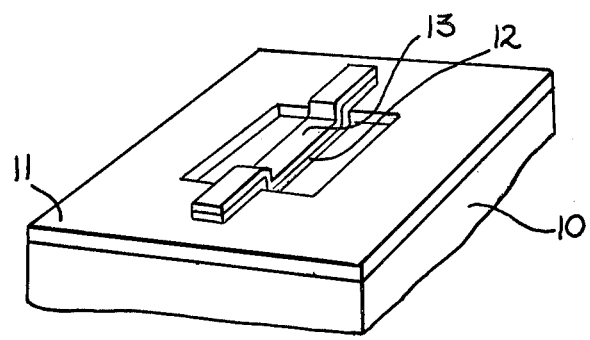
FIG. 5A is a perspective view of a portion of the device at the stage of FIG. 5.

A layer 13 of polycrystalline silicon is then deposited over the entire surface of the wafer as shown in FIG. 4. Portions of this layer 13 and layer 12 are then removed, again by standard prior art techniques, leaving only strips of polycrystalline silicon which are to become either the gate element of the device (layer 13) or interconnects. The layer 13 is seen to be separated from the substrate 10 by a thin insulating layer of silicon dioxide 12. (It should be noted that an opening in the thin oxide may be appropriate prior to forming layer 13 whereupon the layer 13 may then also be employed as a contact and an interconnect in accordance with U.S. Pat. No. 3,699,646 assigned to the assignee of the subject invention.)

Figure 6:
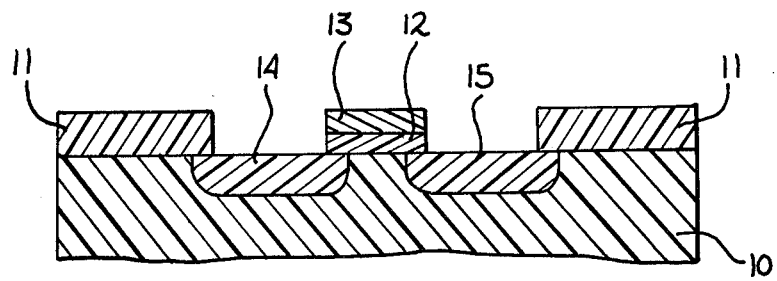
FIG. 6 is a cross-sectional view of the device after formation of the source and drain.
Figure 7:
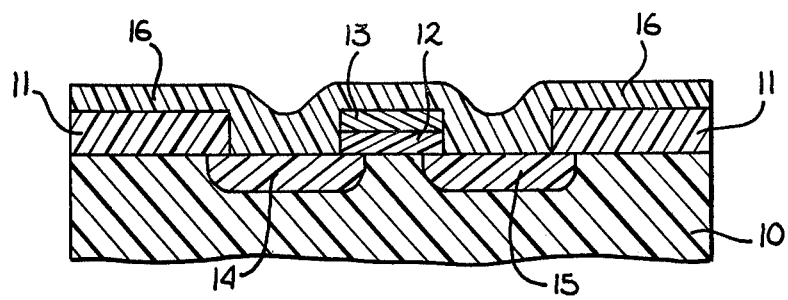
FIG. 7 shows the addition of layer of silicon oxide to the device as shown in FIG. 6.

Next, source 14 and drain 15 are formed and the gate is doped with a type impurity (e.g., phosphorous, arsenic, antimony, etc.), as is done in the prior art. Subsequently, the entire wafer surface is covered with a coating of silicon dioxide 16 by vapor deposition. (These steps are illustrated in FIGS. 6 and 7.) Openings are then etched through oxide coating 16 to uncover a portion of the souce 14 and drain 15. It should be understood that while reference has been frequently made above to diffusion, ion implantation may be employed in combination with diffusion or alone to obtain a desired impurity profile. This is true throughout the application where reference is made to diffusion.

Figure 8:
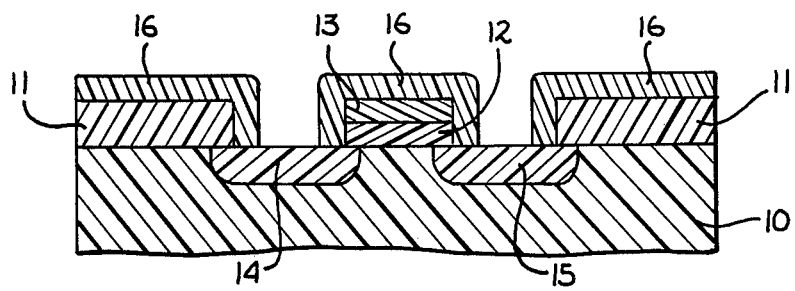
FIG. 8 is a cross-sectional view of the device after having a portion of the silicon oxide layer removed over the source and drain.
Figure 9:
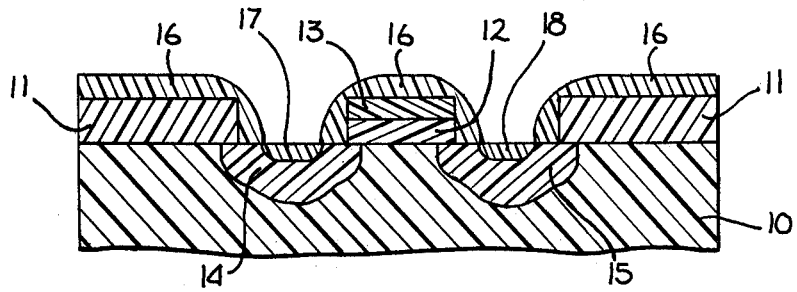
FIG. 9 is a cross-sectional view of the device of FIG. 8 after a diffusion of phosphorous.
Figure 10:
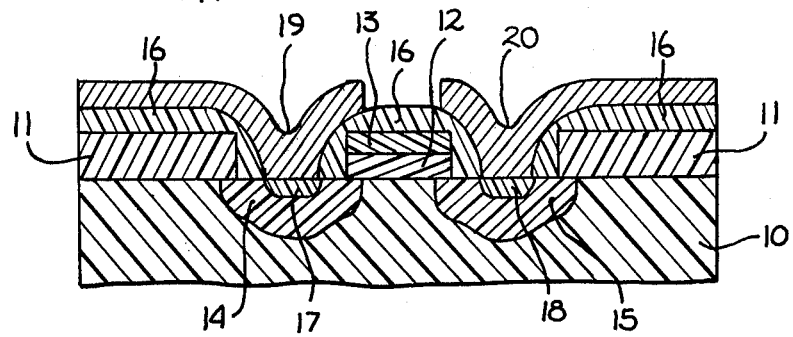
FIG. 10 is a cross-sectional view of a completed MOSFET made in accordance with the present invention.

The process to this point has been disclosed in the prior art and has been in common use for some time and consequently, the description has not been greatly detailed. There are numerous alternatives to arriving at the same general partially completed device shown in FIG. 8 with various steps rearranged and/or other steps or materials added or deleted.

The next steps in the process would normally involve the forming of a metalization layer. In the subject invention, prior to metalization and after formation of the source and drain (or other region), the surface is subjected to a heavy diffusion of an n-type impurity which causes regions 17 and 18 of n++ conductivity type silicon to be formed in the substrate (e.g., solid solubility at over 1000° C). Preferably, phosphorus is employed as the impurity or dopant. The phosphorous diffusion is preferably made heavy enough and at a temperature to cause rounding of the corners on layer 16 of silicon oxide. This corner rounding makes possible smaller than standard sized metal interconnects, thereby saving space. It should be noted that an earlier glass forming step may be employed to assist in rounding the corner. This aspect of the process is disclosed in Great Britain Pat. No. 1,326,947 assigned to the assignee of the subject application. It should be noted that in one form of the invention the additional diffusion or impurity addition is employed with a prior diffusion or impurity addition wherein in both instances the impurity employed is phosphorous. It is possible and desirable in some devices to employ arsenic or antimony as an impurity in connection with the first diffusion or impurity addition and phosphorous in connection with the second impurity addition to the source and drain region. Since arsenic and antimony are much slower diffusants than phosphorous, this will result in a shallow junction in the region most closely adjacent the gate and a substantially deeper junction in the portion of the source and drain removed from the gate and in the proximity of the contact metalization. Thus, the gate to drain capacitance is maintained at a relatively low value providing high speed performance while all of the advantages of the invention are attained.

Following the extra diffusion the wafer is then dipped in an etchant which thins layer 16 somewhat and removes any oxides formed during the phosphorus diffusion. After the etchant dip, the device is completed by formation of contacts 19 and 20 on the surface of the wafer, which may provide a means for connecting the device to an external circuit, to other devices on the same substrate, or to another layer of interconnect.

The very high surface concentration of phosphorous has been found to have some unique, important and surprising results. The silicon at the surface appears to be strained by the diffusion to such an extent that there is no longer preferential etching in the "100" direction and consequently "spiking" of the source and drain junctions is substantially reduced. In addition, the source and drain are driven deeper so that any spikes, if such did exist, would not be as apt to penetrate the junctions. The nature of the source and drain are also changed to enable an alloying cycle of a less critical nature and/or to permit pure aluminum to be used rather than an aluminum silicon alloy for metalization.

Another important result of the invented device is that the bulk lifetime of minority carriers is greatly increased so that when being used as a part of a dynamic memory device, the refresh rate can be substantially reduced. In one experiment refresh rates for prior art devices were in the order of 10 microseconds to a millisecond whereas, with the invented device, a refresh rate of 0.5 seconds to 2 seconds was noted. This dramatic result which was not contemplated is apparently attained by the placing of a gettering material (heavily n++ phosphorous doped material) in contact with the substrate and in such close proximity to the junction of the device. It should be noted that all of the advantages of the present invention are accomplished without an additional masking step. This is particularly important since the addition of masking steps commonly decreases the yields and densities attainable.

The present invention has been described as a conventional n channel MOS device, but it will be clear to those skilled in the art that the same principles can be applied to other devices with advantage. For example, it is contemplated within the spirit of the invention that charge coupled devices or stepless MOS devices can be constructed in accordance with the present invention. While in the presently preferred embodiment of the invention, the n++ diffusion is of phosphorous, it has been found that in some devices arsenic could also be used with similar advantages.

I claim:

1. A field effect semiconductor device which comprises:
    (a) a $p$ type semiconductor region;
    (b) a pair of spaced $n$ type regions diffused into the surface of said $p$ type region, said spaced $n$ type regions forming the source and drain regions and defining a channel of said field effect semiconductor device;
    (c) at least one gate element insulated from said $p$ type semiconductor region and located between and in a substantially nonoverlapping relationship with said spaced $n$ type regions;
    (d) a pair of n++ type regions, formed by diffusion of an impurity, within the pair of said spaced $n$ type regions and
    (e) pn junctions between each of said $n$ type regions and said $p$ type region, those portions of each said pn junction directly adjacent said channel being shallower, with respect to said surface, than deeper portions of said pn junctions, said deeper portions being more distal from said channel.

2. The device of claim 1 where impurity is selected from the group consisting of phosphorous and arsenic.

3. The device of claim 1 wherein said $p$ type semiconductor region has a 100 plane crystal orientation.

* * * * *